US012631698B2

(12) United States Patent
Shah et al.

(10) Patent No.:     US 12,631,698 B2
(45) Date of Patent:          May 19, 2026

(54) APPARATUS, SYSTEM AND METHOD OF MONITORING JOINTS AND SWITCH CONDITIONS IN AN ELECTRICAL NETWORK

(71) Applicant: EATON INTELLIGENT POWER LIMITED, Dublin (IE)

(72) Inventors: Viral Shah, Surat (IN); Gurmeet Singh, Pune (IN); Jagdambika Srivastava, Gonda (IN); Joshua D. Myers, Fletcher, NC (US); Mark A. Gould, Baden, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 554 days.

(21) Appl. No.: 18/141,490

(22) Filed: May 1, 2023

(65) Prior Publication Data

US 2024/0369647 A1     Nov. 7, 2024

(51) Int. Cl.

| | |
|---|---|
| *G01R 31/68* | (2020.01) |
| *G01R 19/02* | (2006.01) |
| *G01R 19/10* | (2006.01) |
| *G01R 27/20* | (2006.01) |
| *H02J 9/06* | (2006.01) |

(52) U.S. Cl.
CPC ............. *G01R 31/68* (2020.01); *G01R 19/02* (2013.01); *G01R 19/10* (2013.01); *G01R 27/205* (2013.01); *H02J 9/06* (2013.01)

(58) Field of Classification Search
CPC ...... G01R 19/02; G01R 19/10; G01R 27/205; G01R 31/68; H02J 3/0073; H02J 9/06; H02J 9/068
See application file for complete search history.

(56) References Cited

U.S. PATENT DOCUMENTS

| | | | |
|---|---|---|---|
| 7,034,554 B2 | 4/2006 | Loucks | |
| 7,847,562 B2 | 12/2010 | Montgomery et al. | |
| 2016/0118802 A1* | 4/2016 | Castillo | G06F 1/30 |
| | | | 307/18 |
| 2017/0254852 A1* | 9/2017 | Gould | H02J 9/061 |
| 2018/0275199 A1* | 9/2018 | Parkin | G01R 19/2513 |
| 2024/0030741 A1* | 1/2024 | Bose | H02J 9/068 |
| 2024/0162838 A1* | 5/2024 | Pmsvvsv | H02H 7/1227 |

* cited by examiner

*Primary Examiner* — Judy Nguyen
*Assistant Examiner* — Adam S Clarke
(74) *Attorney, Agent, or Firm* — Eckert Seamans Cherin & Mellott, LLC

(57)     ABSTRACT

An automatic transfer switch structured to switch between a first power source and a second power source to supply continuous power to a load includes a power switching mechanism including a switch structured to couple the load to one of the first power source and the second power source; a plurality of sensors including a voltage sensor coupled to a joint on first power source side, a voltage sensor coupled to a joint on second power source side, a voltage sensor coupled to a joint on load side, and a current sensor structured to sense current flowing through the switch; and a controller coupled to the power switching device and the plurality of sensors and structured to control operation of the ATS, the controller including a fault identifier structured to detect and identify a fault within the ATS and estimate severity of the fault.

19 Claims, 10 Drawing Sheets

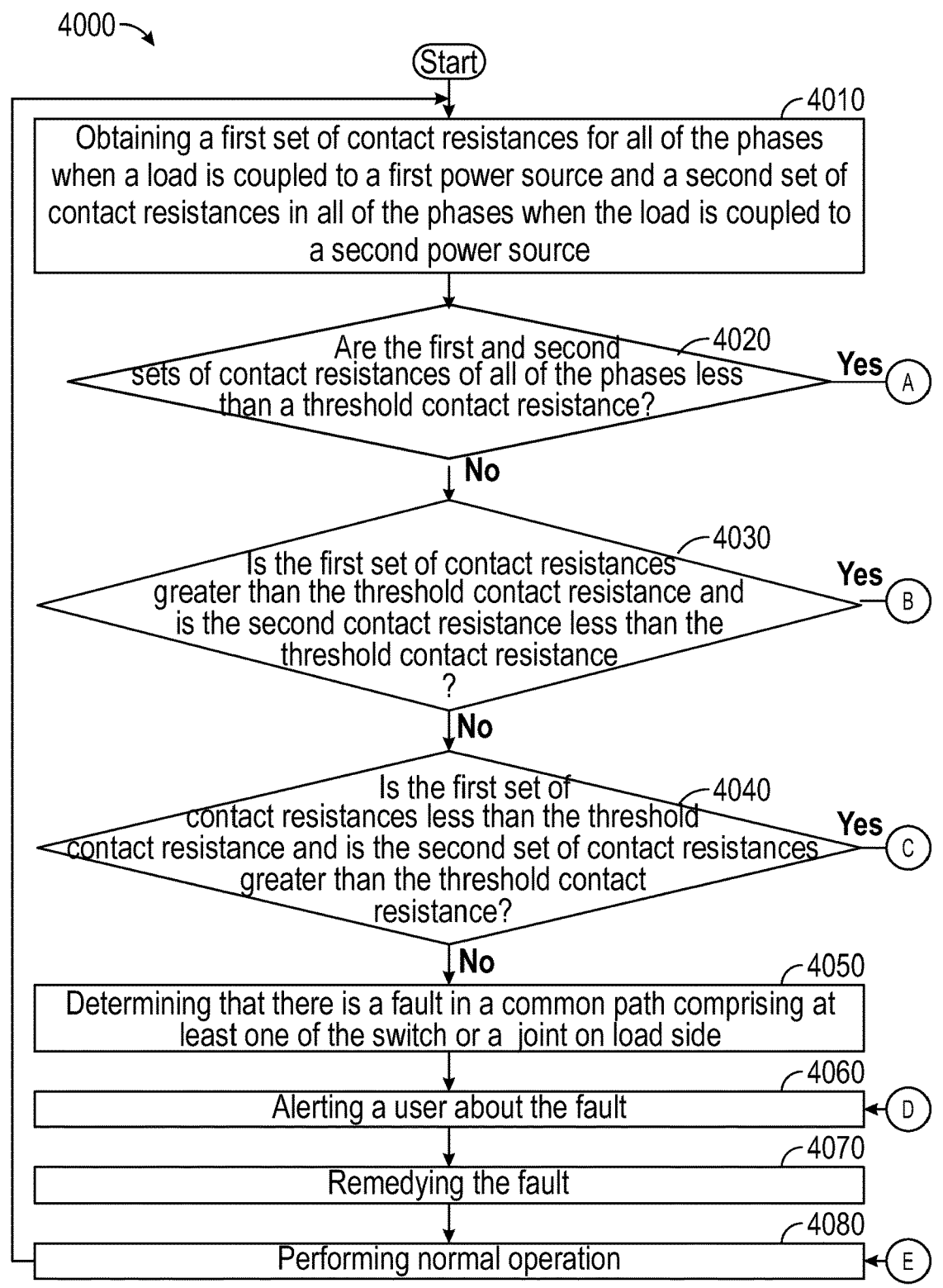

4000

Start

4010
Obtaining a first set of contact resistances for all of the phases when a load is coupled to a first power source and a second set of contact resistances in all of the phases when the load is coupled to a second power source 4020
Are the first and second sets of contact resistances of all of the phases less than a threshold contact resistance? Yes A

No

4030
Is the first set of contact resistances greater than the threshold contact resistance and is the second contact resistance less than the threshold contact resistance ? Yes B

No

4040
Is the first set of contact resistances less than the threshold contact resistance and is the second set of contact resistances greater than the threshold contact resistance? Yes C

No

4050
Determining that there is a fault in a common path comprising at least one of the switch or a joint on load side 4060
Alerting a user about the fault D 4070
Remedying the fault 4080
Performing normal operation E

APPARATUS, SYSTEM AND METHOD OF MONITORING JOINTS AND SWITCH CONDITIONS IN AN ELECTRICAL NETWORK

FIELD OF THE INVENTION

The disclosed concept relates generally to an apparatus, system and method of monitoring joint and contact conditions in an electrical network, and in particular an apparatus, system, and method of detecting and identifying a fault in an automatic transfer switch and estimating severity of the fault.

BACKGROUND OF THE INVENTION

An automatic transfer switch is a device used to provide continuous supply to a load and protect the load against loss of power (e.g., power outage, decrease in power below a required amount, etc.). During utility power failure, the automatic transfer switch switches a power supply from the utility source to a backup (e.g., a generator). Typically, switching device (e.g., contactor, circuit breaker etc.) are connected with power sources (e.g., the utility power and the backup) at input joint and connected with a load at an output joint through cables by bolted joints. Upon the power failure, a switch connecting the utility power to the load is disconnected and the other switch connecting the backup power to the load is connected. When the power is restored, the other switch connecting the backup power to the load disconnects and the switch connecting the utility to the load is reconnected. As such, the automatic transfer switch is a critical component for safe and reliable transition between energy sources in cases of emergency.

However, the repeated switching operations cause deterioration of the mechanical components, leading to various faults. Loose contact and contactor wear are the most common type of fault occurring inside the panel. These faults lead to an increase in temperature and generate hot spots due to power losses ($I^2R$). If not rectified on time, such faults may degrade the performance of components and devices within the power system due to high temperature, and possibly catch fire. Some methods to detect these faults use instantaneous values of voltages and currents using impedance. However, getting such instantaneous values is not possible for most of the power system. For example, external sensors (e.g., thermal or acoustic sensors) at multiple locations need to be installed to measure the instantaneous values. However, adding the external sensors require associated hardware and spaces for the sensor and hardware installation, resulting in increased designing and monitoring cost. Further, the conventional methods require routine maintenance to detect faulty nodes. Such a routine maintenance is time-consuming, ineffective, and reactionary since it allows, among others, corrections only upon on-site detection at preset intervals.

There is room for improvement in a mechanism to detect failure modes and faulty conditions in an automatic transfer switch.

SUMMARY OF THE INVENTION

These needs, and others, are met by embodiments of the disclosed concept in which an automatic transfer switch (ATS) is provided. The ATS is structured to switch between a first power source and a second power source to supply continuous power to a load. The ATS includes a power switching mechanism including a switch structured to couple the load to one of the first power source and the second power source; a plurality of sensors including a voltage sensor coupled to a joint on first power source side, a voltage sensor coupled to a joint on second power source side, a voltage sensor coupled to a joint on load side, and a current sensor structured to sense current flowing through the switch; and a controller coupled to the power switching device and the plurality of sensors and structured to control operation of the ATS, the controller including a fault identifier structured to detect and identify a fault within the ATS and estimate severity of the fault.

Another embodiment provides a method of monitoring joint and switch conditions in an automatic transfer switch (ATS). The method includes providing an ATS that comprises: (i) a power switching mechanism including a switch structured to couple a load to one of a first power source and a second power source; (ii) a plurality of sensors including a voltage sensor coupled to a joint on first power source side, a voltage sensor coupled to a joint on second power source side, a voltage sensor coupled to a joint on load side, and a current sensor structured to sense current flowing through the switch; and (iii) a controller coupled to the power switching device and the plurality of sensors and structured to control operation of the ATS, the controller including a fault identifier structured to detect and identify a fault within the ATS and estimate severity of the fault. The method further includes obtaining root-mean-square (RMS) values including input voltage from a connected power source, output voltage to the load, and the current flowing through the switch; obtaining delta voltage between the input voltage and the output voltage; and obtaining a power loss and a contact resistance over the switch, wherein the power loss is obtained by multiplying the delta voltage with the current flowing through the switch and the contact resistance is obtained by dividing the delta voltage by the current flowing through the switch.

Yet another example embodiment provides an energy monitoring system. The energy monitoring system includes a plurality of power sources including a first power source and a second power source; a load; and an automatic transfer switch (ATS) structured to connect the load to one of the first power source and the second power source, switch between the first power source and the second power source based at least in part on a power outage or a user command, and supply continuous power to the load. The ATS includes a power switching mechanism including a switch structured to couple the load to one of the first power source and the second power source; a plurality of sensors including a voltage sensor coupled to a joint on first power source side, a voltage sensor coupled to a joint on second power source side, a voltage sensor coupled to a joint on load side, and a current sensor structured to sense current flowing through the switch; and a controller coupled to the power switching mechanism and the plurality of sensors and structured to control operation of the ATS, the controller including a fault identifier structured to detect and identify a fault within the ATS and estimate severity of the fault.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE INVENTION

Figure 1:
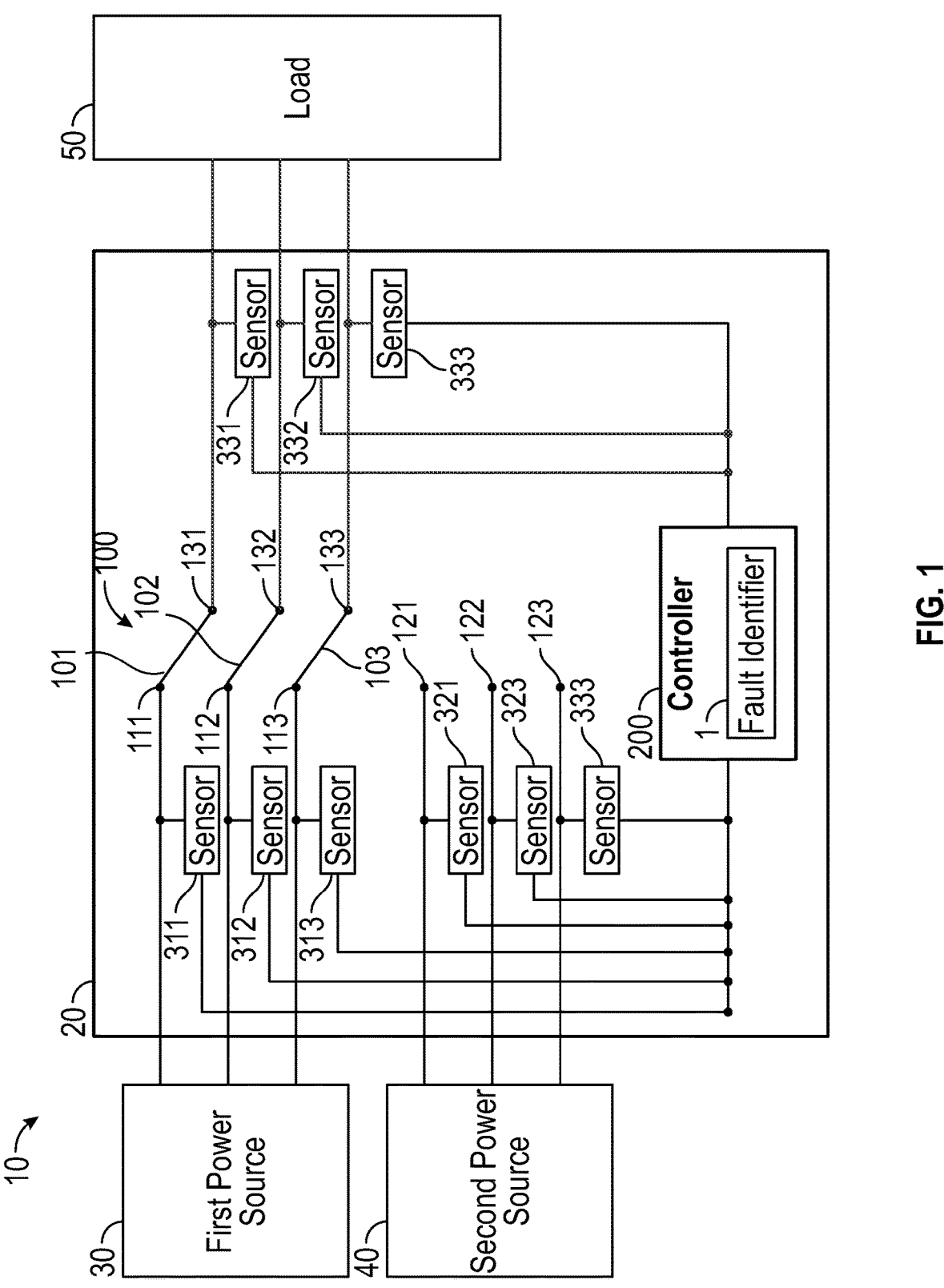
FIG. 1 is a diagram of a power system including an automatic transfer switch coupled to a 3-phase power supply and a load in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

Some example embodiments of the disclosed concept, which will be described in more detail herein, provide an apparatus and method to detect and identify the fault and estimate severity of the fault within automatic transfer switch (ATS). When identifying the fault, an example embodiment in accordance with the disclosed concept identify a type of the fault (e.g., without limitation, a loose joint, switch wear, etc.), a phase in which the fault occurred, a region or path (e.g., without limitation, a first power source side, a second power source side, a load side, a contact terminal at a source, or load side, a joint at a source or load side, etc.) of fault in the ATS. Such identification allows a user (e.g., without limitation, utility or field engineer) to remedy the fault promptly. By estimating the severity of fault, the example embodiment allows for in-kind remedial actions to be performed. For example, if a fault detected is estimated to have insignificant severity level (e.g., below a threshold requiring an intervention), the example embodiment can tolerate the fault and operate as a fault tolerant system.

Further, the example embodiment detects and identifies a fault and estimates its severity using only root mean square (RMS) values of voltages and current measured at one or more sources and a load. Using only the RMS values, the example embodiment obtains impedances and power losses associated with switches, and based on the impedances and power losses the example embodiment can easily detect and identify a fault and estimate severity. Such use of only the RMS values is advantageous in that unlike instantaneous values, the RMS values are easily inexpensively obtained. For example, a simple multi-meter can be used to obtain the RMS values, rather than having to install special external sensors required for measuring the instantaneous values. Further, using only the RMS values allows the example embodiment to work using an AC and DC, single- or multi-phase power source applications. In addition, by measuring the RMS values for each phase, the example embodiment allows for effectively and accurately detecting and identifying a fault and estimating its severity, and even operating effectively with unbalanced 3-phase currents, which household power distribution systems regularly encounter. Moreover, by using the already available electrical signals, the example embodiment eliminates a need and associated costs for installing special external sensors and hardware associated with the external sensors. In addition, the example embodiment allows the user to perform preventative maintenance, not reactionary.

FIG. 1 is a diagram of a power distribution system 10 in accordance with an example embodiment of the disclosed concept. The power distribution system 10 includes an automatic transfer switch (ATS) 20, a first power source 30, a second power source 40, and a common load 50. The first power source 30 may be, for example and without limitation, a utility power supply and provides power to the common load 50 during normal operation. The second power source 40 may be a backup, emergency power supply, for example and without limitation, a generator, a transformer, etc., and provides power to the common load 50 during utility power outage. However, it will be appreciated that a utility power supply and a backup power supply are provided as an example, other arrangements and types of power sources may be employed without departing from the scope of the disclosed concept. While FIG. 1 shows two power sources 30,40, there may be more than two power sources as appropriate without departing from the scope of the disclosed concept. Additionally, while a 3-phase of power flowing through the ATS 20 is shown for simplicity of illustration, it will be appreciated that the ATS 20 may accommodate a single or other multiple-phase of power supplies applicable to AC and/or DC applications.

The ATS 20 includes a power switching mechanism 100 operable to selectively switch between providing the common load 50 with power from the first power source 30 to providing the common load 50 with power from the second power source 40, and vice versa. The power switching mechanism 100 may be composed, for example, of one or more switches 101,102, 103 structured to couple the load 50 to one of the first power source 30 and the second power source 30. The first power source side has terminals and joints 111-13, the second power source side has terminals and joints 121-23, and the load side has terminals and joints 131-33. Hereinafter, the terminals and joints 111-13, 121-23, 131-33 may also be referred to as joints. Only one source can be connected with the load 50 at a time. The ATS 20 also includes a controller 200 structured to control operation of the power switching mechanism 100. The controller 200 may control operation of the ATS 20 including, at least the operation of the power switching mechanism 100 based on inputs from one or more sensors 311-13, 321-23, 331-33 within the ATS 20 or manually via external input. As a result of repeated switching, components in the power switching mechanism 100 or elsewhere in the ATS 20 may experience contact wear. Joints in the power switching mechanism 100 or elsewhere in the ATS 20 may experience loose or overtight conditions, which can result in deteriorated performance.

Contact wear and loose or overtight joint conditions can be detected by a change in resistance across the contact or joint. In example embodiment of the disclosed concept, the controller 200 is structured to detect contact wear and loose or overtight joint conditions based on outputs of a plurality of sensors 311-13, 321-23, 331-33 structured to sense voltages and currents at inputs and outputs of the power switching mechanism 100. The sensors 311-13, 321-23, 331-33 include voltage sensors 311-13 coupled to joints 111-13 on the first power source side, voltage sensors 321-23 coupled to joints 121-23 on the second power source side, voltage sensors 331-33 coupled to joints 131-33 on the load side, and current sensors 331-33 structured to sense currents flowing through the switches 101,102,103. However, it will be appreciated that the types and locations of the sensors may be varied without departing from the scope of the disclosed concept. For example, the controller 200 receives sensor outputs from before and after the area of interest and determines if there is a condition of concern (e.g., without limitation, contact wear, loose joint) in the area of interest based on the sensor output. As an example, a change in contact resistance is determined based on a voltage change across the area of interest.

The controller 200 may include a processor, a memory and a fault identifier 1. The processor may be, for example and without limitation, a microprocessor, a microcontroller, or some other suitable processing device or circuitry, that interfaces with the memory. The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory. The fault identifier 1 can be an algorithm or logic stored within the memory of the controller 200 and/or updatable via a utility cloud (not shown). The fault identifier 1 is structured to detect and identify a fault within the ATS 20 and estimate severity of the fault. The fault identifier 1 or the controller 200 can alert the user of any detected fault so that the user can take appropriate remedial actions.

In general, a very high current flows through the power distribution system 10, particularly the power switching mechanism 100. Common faults occurring within the ATS 20 include a loose joint that occurs at a power source side or load side and a contactor wear (e.g., without limitation, a contactor plate wear) that occurs inside the switches 101-103 due to erosion and repeated switching. These faults result in increases in contact resistance and a potential drop (hereinafter, also referred to as a delta voltage or $DV_n$, n referring to an associated phase) across the loose joint or worn-out switch. In a perfectly healthy system, this potential drop is zero. However, where there is a resistance in a path of current flow, there will be a potential drop. This potential drop will lead to heat dissipation due to $I^2R$ value.

In order to determine whether there is a fault within the ATS 20 and its severity, the fault identifier 1 first obtains 6 RMS values including 3 input phase voltages from a connected power source 30 or 40, 3 output-phase voltages to the load 50, and 3-phase currents flowing through respective switches. The fault identifier 1 then obtains delta voltages between the input phase voltages and respective output phase voltages and determines if there is a fault based on the RMS values and the delta voltages. The fault identifier 1 determines if there is a fault by obtaining power losses for each phase and contact resistances over the switches 101, 102,103 in each phase. The power losses are obtained by multiplying the delta voltages by respective phase currents, and the contact resistances are obtained by dividing the delta voltages by respective phase current.

Based on the contact resistances, the fault identifier 1 determines if any fault has occurred. The fault identifier 1 determines that there is a fault based on a determination that the contact resistance at a phase is greater than a threshold contact resistance (e.g., without limitation, contact resistances obtained using switches and joints in healthy condition, i.e., having 35 N-m torque). The fault identifier 1 may estimate the severity of the fault based on the power losses. For such estimation, the fault identifier 1 determines if a power loss at a phase is within a threshold power loss (e.g., a rated power or power losses obtain using switches and joints in healthy condition). The fault identifier 1 causes the ATS 20 to tolerate the fault and perform normal operation based on a determination that the power loss is within the threshold power loss. If the power loss is within the threshold power loss, the severity of the fault is at a level that can be tolerated by the ATS 20. Based on a determination that the power loss is beyond the threshold power loss, the controller 200 transmits an alert to a user about the fault such that the user remedies the fault based on the alert. The user may remedy the fault by, e.g., without limitation, replacing a faulty component or tightening a loose joint. Upon remedying the fault, the ATS 20 performs normal operation including the detection and identifying of a fault and estimation of fault severity.

The fault identifier 1 may be further structured to identify a specific location of the fault. If the first power source 30 and the second power source 40 are single-phase power sources, the fault identifier 1 may determine that the fault is in a path between the first power source 30 and the load 50 if a first contact resistance obtained when the first power source 30 is coupled to the load 50 is greater than the threshold contact and if a second contact resistance obtained when the second power source 40 is coupled to the load 50 is lesser than the threshold contact resistance. The fault identifier 1 may determine that the fault is in a path between the second power source 40 and the load 50 if a second contact resistance obtained when the second power source 40 is coupled to the load 50 is greater than the threshold contact and if a first contact resistance obtained when the first power source 30 is coupled to the load 50 is lesser than the threshold contact resistance. The fault identifier 1 may determine that the fault is in one of the switches 101,102,103 or the joint 131-33 on the load side based on a determination that a first contact resistance obtained when the first power source 30 is coupled to the load 50 is greater than the threshold contact resistance and a second contact resistance obtained when the second power source 40 is coupled to the load 50 is also greater than the threshold contact resistance.

If the first power source 30 and the second power source 40 are multi-phase power sources, the fault identifier 1 may determine that the fault is in a path between the first power source 30 and the load 50 if a first set of contact resistances of all of the phases obtained when the first power source 30 is coupled to the load 50 is greater than the threshold contact and if a second set of contact resistances of all of the phases obtained when the second power source 40 is coupled to the load 50 is lesser than the threshold contact resistance. The fault identifier 1 may determine that the fault is in a path between the second power source 40 and the load 50 if the second set of contact resistances of all of the phases obtained when the second power source 40 is coupled to the load 50 is greater than the threshold contact and if the first set of contact resistances of all of the phases obtained when the first power source 30 is coupled to the load 50 is lesser than the threshold contact resistance. The fault identifier 1 may determine that the fault is in a common path, e.g., without limitation, one of the switches 101,102,103 or the joint 131-33 on the load side, based on a determination that the first set of contact resistances of all of the phases obtained when the first power source 30 is coupled to the load 50 is greater than the threshold contact resistance and the second set of contact resistances of all of the phases obtained when the second power source 40 is coupled to the load 50 is also greater than the threshold contact resistance.

The fault identifier 1 may determine that fault is in a specific phase. For example, when three-phase power sources are used, the fault identifier 1 may determine that there is a fault in a first phase (e.g., without limitation, R-phase) based on a determination that changes in contact resistances in the first phase and a third phase (e.g., without limitation, B-phase) are higher than contact resistances of these phases obtained when switches 101,103 and joints 111, 113, 121, 123, 131, 133 in these phases are in healthy condition. The fault identifier 1 may determine that fault is in a second phase (e.g., without limitation, Y-phase) based on a determination that changes in contact resistances in the first phase and the second phase are higher than contact resistances of these phases obtained when switches 101,102 and joints 111,112,121,122,131,132 in these phases are in healthy condition. The fault identifier 1 may determine that fault is in the third phase based on a determination that changes in contact resistances in the second phase and the third phase are higher than contact resistances of these phases obtained when switches 102,103 and joints 112,113, 122,123, 132,133 in these phases are in healthy condition. The fault detection and identification of the fault and its specific location, and/or fault severity estimation using the three-phase power sources are discussed further in detail with reference to FIGS. 3-8. While FIGS. 3-8 illustrate the example embodiments in three-phase power source application, it is for illustrative purposes only and it will be understood that the example embodiments of the disclosed concept can be applied to any-phase power source applications.

Figure 2A:
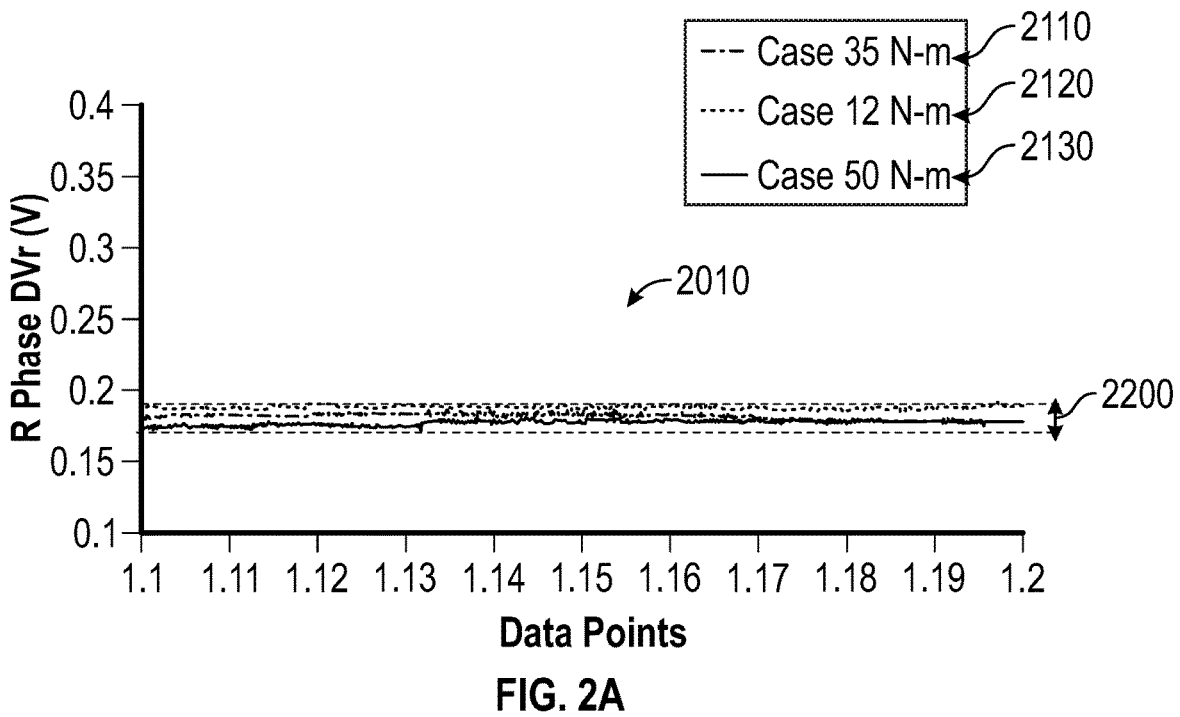
FIGS. 2A-C are graphs depicting voltage drops between a source power supply and a load within the automatic transfer switch of FIG. 1 in accordance with an example embodiment of the disclosed concept.
Figure 2B:
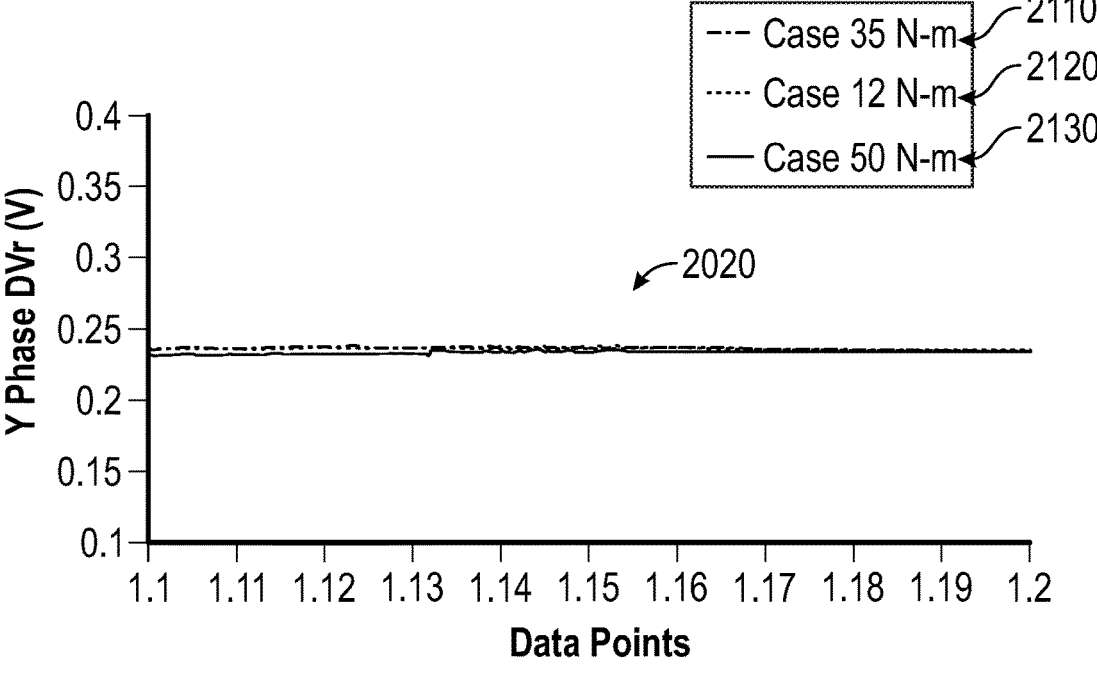
Figure 2C:
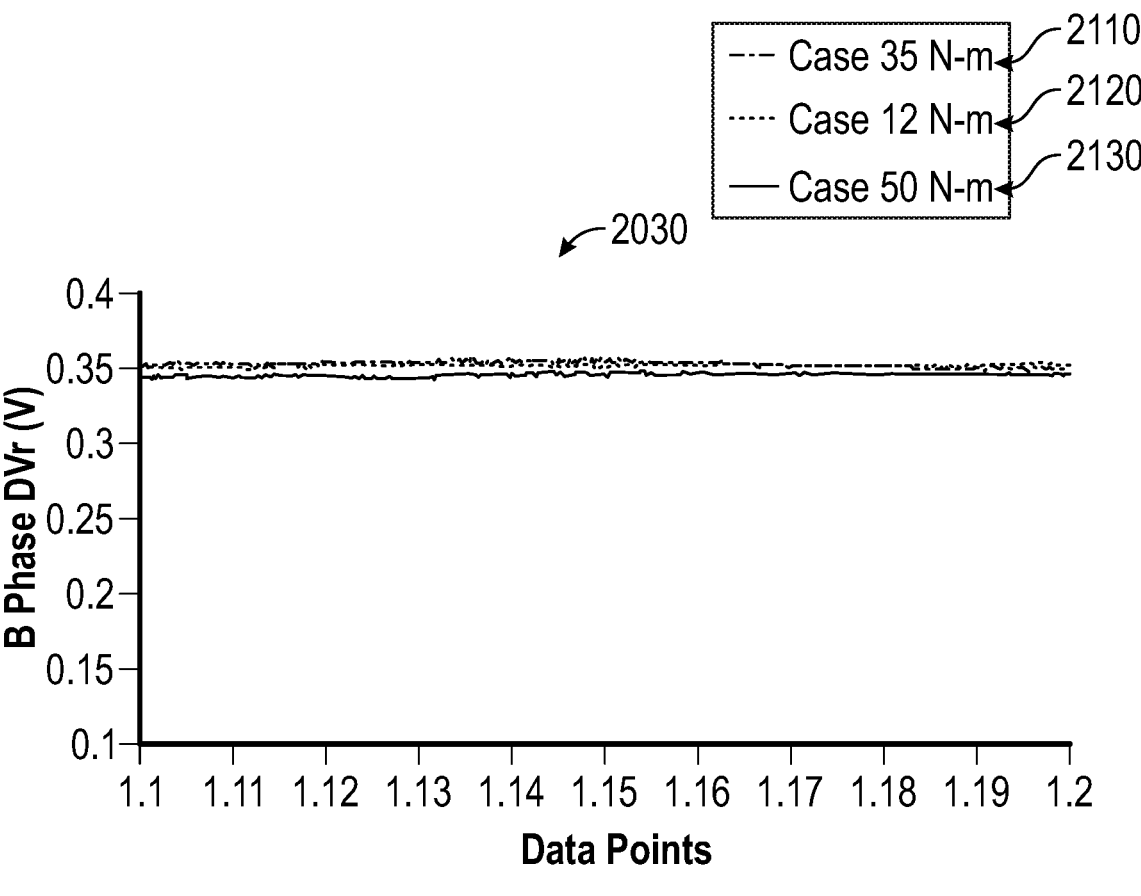

FIGS. 2A-C illustrate graphs depicting experimental results of voltage drops between a connected power source 30,40 and a load 50 using the ATS 20 of FIG. 1 in accordance with a non-limiting, example embodiment of the disclosed concept. For experimental purposes, the switch in a first phase (i.e., R-phase here) has been intentionally loosened. Experiments were performed using switches and joints in healthy condition and switches in overtight condition in all phases. Signal 2110 is delta voltages between 3 input phase voltages from the connected power source 30,40 and 3 output voltages to the load 50 obtained using a switch and joints in healthy condition. A healthy switch may be, e.g., without limitation, a switch having 35 N-m torque. Signal 2120 is the delta voltages between 3 input voltages and 3 output voltages obtained using a switch having 12 N-m torque. That is, this switch has not been properly tightened, and thus has a fault, e.g., without limitation, a loose joint. Signal 2130 is the delta voltages between 3 input voltages and 3 output voltages obtained using a switch in an overtight condition, e.g., without limitation, a switch having 50 N-m torque. FIG. 2A shows R-phase deltas 2010 captured over a plurality of data points.

In FIG. 2A, there is a voltage drop of approximately 0.181V for the switch and joints in healthy condition, whereas the switch in loose condition has a voltage drop of approximately 0.188V. As such, there is an increase 2200 of the voltage drop for the switch in loose condition as compared to the voltage drop for the switch and joints in healthy condition. This indicates that the fault identifier 1 of the controller 200 has successfully detected a fault (e.g., a loose joint) in the R-phase. FIG. 2B shows Y-phase deltas 2020 captured over a plurality of data points, showing no differences in the deltas. Thus, the fault identifier 1 has correctly determined that there is no fault in Y-phase. FIG. 2C shows B-phase deltas 2030 captured over a plurality of data points, showing correctly that no differences in the deltas. Thus, the fault identifier 1 has correctly determined that there is no fault in B-phase. In short, for the switches and joints in healthy condition, the deltas of all phases are the same. In a case involving a loose joint, however, the delta DVr increases in the R-phase as compared to the delta of the switch in the healthy condition. Thus, the fault identifier 1 successfully identified specific phase (i.e., R-phase) in which the fault has occurred. Subsequently, the delta DVr value is divided by the current to estimate its contact resistance since a loose joint is associated with an increase in the resistance value with respect to the resistance value of the switch in healthy condition. Table 1 below enumerates the obtained experimental results. Table 1 shows that an overtight joint will have a reduced resistance value as compared to that of a healthy joint. It also shows that the associated power loss of the loose joint is highest.

TABLE 1

| Joint Case (R-Phase) | DVr (mV) | Current (A) | Contact Resistance (mΩ) | Power Loss (W) |
|---|---|---|---|---|
| Healthy (35 N-m) | 181 | 1600 | 0.113 | 289.6 |
| Over-tight (50 N-m) | 177 | 1600 | 0.110 | 283.2 |
| Loose joint (12 N-m) | 188 | 1600 | 0.117 | 300.8 |

Figure 3:
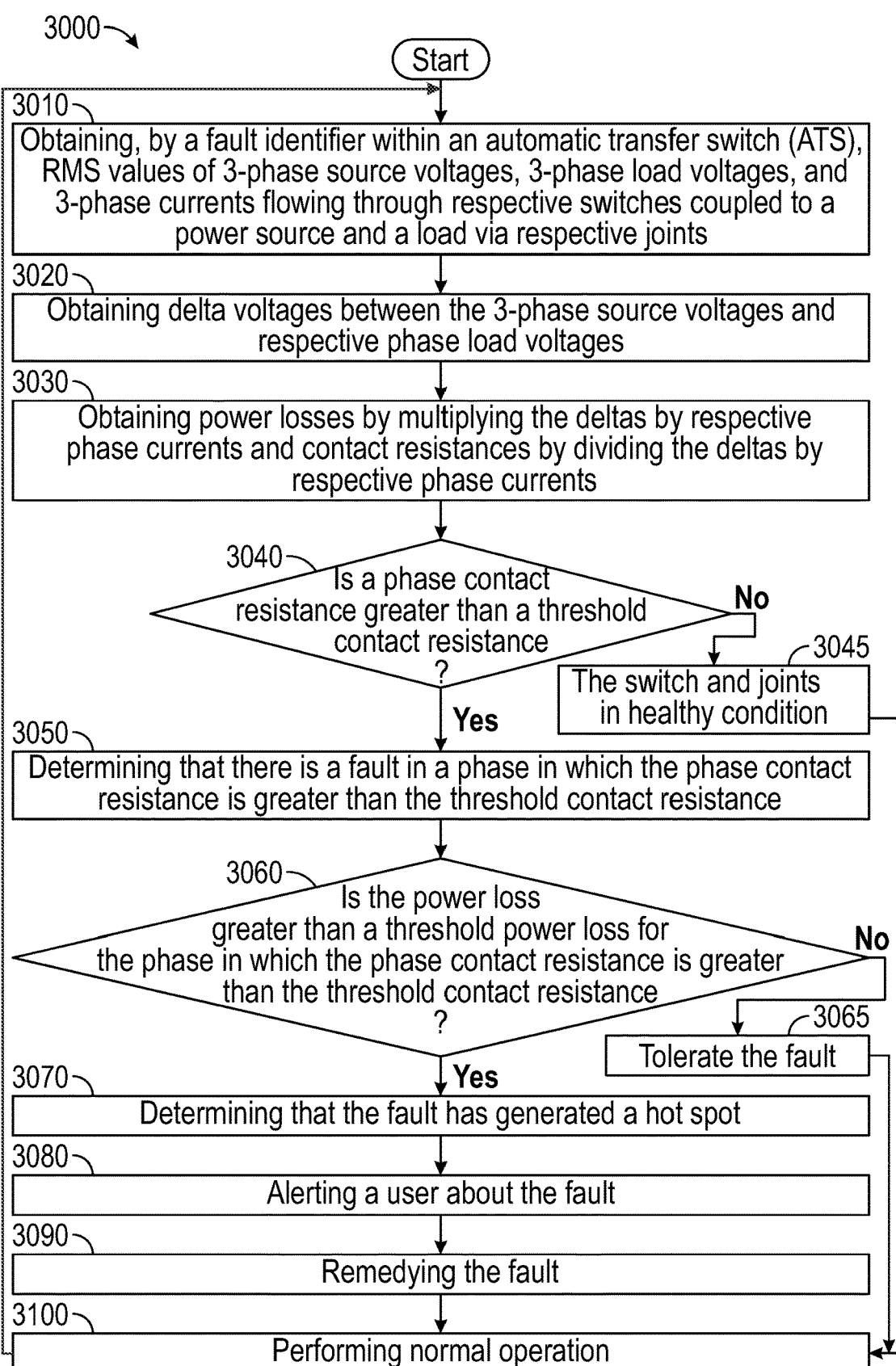
FIG. 3 is a flow chart for a method of monitoring joint and switch conditions in accordance with an example embodiment of the disclosed concept.

FIG. 3 is a flow chart for a method 3000 of monitoring switch and joint conditions in accordance with an example embodiment of the disclosed concept. The method 3000 detects a fault in a phase(s) and identifies the phase. The method 3000 may be performed by the fault identifier 1 or the controller 200 of the ATS 20 as described with reference to FIG. 1.

At 3010, the fault identifier obtains RMS values of 3 input phase voltages from a connected power source, 3 output phase voltages to a load, and 3 phase currents flowing through respective switches coupled to the power source and the load via joints.

At 3020, the fault identifier obtains deltas between the input voltages and respective output voltages. For phase R, the delta DVr is determined from subtracting phase-R output voltage from phase-R input voltage. For phase Y, the delta DVy is determined from subtracting phase-Y output voltage from phase-Y input voltage. For phase B, the delta DVb is determined from subtracting phase-B output voltage from phase-B input voltage.

At 3030, the fault identifier obtains power losses for each phase by multiplying the delta voltages by respective phase current. For phase R, power loss Pr is obtained by multiplying R-phase delta DVr by R-phase current Ir. For phase Y, power loss Py is obtained by multiplying Y-phase delta DVy by Y-phase current Iy. For phase B, power loss Pb is obtained by multiplying B-phase delta DVb by B-phase current Ib. The fault identifier obtains contact resistances for each phase by dividing delta voltages by respective phase current. For phase R, contact resistance Rr is obtained by dividing R-phase delta DVr by R-phase current Ir. For phase Y, resistance Ry is obtained by dividing Y-phase delta DVy by Y-phase current Iy. For phase B, resistance Rb is obtained by dividing B-phase delta DVb by B-phase current Ib.

At 3040, the fault identifier determines if a contact resistance for a phase is greater than a threshold contact resistance. The threshold contact resistance is obtained using RMS values of a switch and joints in healthy condition, e.g., without limitation, a switch with a 35 N-m torque. If no, at 3045 the fault identifier determines that the phase switch and joints are healthy and performs normal operation at 3100. If yes, the method 3000 proceeds to 3050.

At 3050, the fault identifier determines that there is a fault in a phase in which the contact resistance is greater than the threshold contact resistance.

At 3060, the fault identifier determines if a power loss for a phase is greater than a threshold power loss for the phase in which the contact resistance is greater than the threshold contact resistance. That is, the fault identifier estimates the severity of the fault based on the power loss. The threshold power loss can be obtained using the RMS values of the switch and joints in healthy condition or a rated power. If no, at 3065 the fault identifier determines that the fault is tolerable and the ATS tolerates the fault and performs normal operation at 3100. That is, the fault in that phase is not significant, i.e., the fault has generated no hot spot that could result in device failure or fire. If yes, the method 3000 proceeds to 3070.

At 3070, the fault identifier determines that the fault has generated a hot spot.

At 3080, the controller transmits an alert to the user about the fault. The alert may identify the fault and the phase in which the fault is detected.

At 3090, the user remedies the fault. The user may inspect the identified phase, both the source side and load side as well as the switch in the identified phase, and remedy the fault by, e.g., without limitation, tightening a loose joint or replacing the switch.

At 3100, the ATS performs normal operation. The normal operation includes detecting and identifying a fault, estimating severity of the fault, etc.

Figure 4:
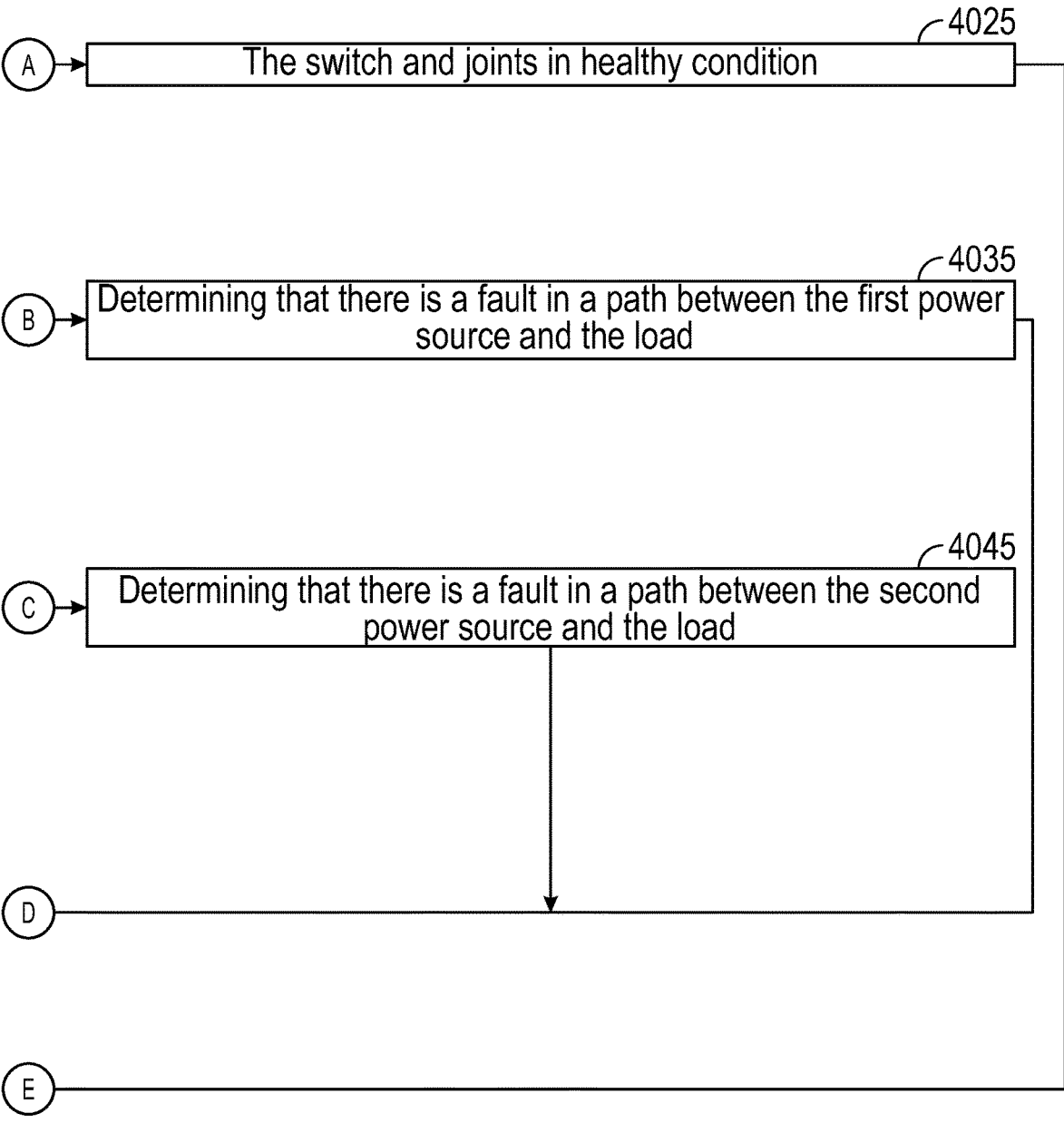
FIG. 4 is a flow chart for a method of monitoring joint and switch conditions in accordance with an example embodiment of the disclosed concept.

FIG. 4 is a flow chart for a method 4000 of monitoring switch and joint conditions in accordance with an example embodiment of the disclosed concept. The method 4000 detects a fault and identifies a specific location (e.g., without limitation, a first power source side, a second power source side, a load side, a switch) of the fault. The method 4000 may be performed by the fault identifier 1 or the controller 200 of the ATS 20 as described with reference to FIG. 1.

At 4010, the fault identifier obtains a first set of contact resistances for all of the phases when a load is coupled to a first power source via respective switches, and a second set of contact resistances in all of the phases when the load is coupled to a second power source via respective switches.

At 4020, the fault identifier determines if the first set of contact resistances and the second set of contact resistances are less than a threshold contact resistance. If yes, at 4025 the fault identifier determines that the switch and joints in each phase are in healthy condition and the ATS performs normal operation at 4080. If no, the method 4000 proceeds to 4030. The joints here refer to switch terminals and joints on source sides and/or load side.

At 4030, the fault identifier determines if the first set of contact resistances is greater than the threshold resistance and the second set of contact resistances is less than the threshold contact resistance. If yes, at 4035 the fault identifier determines that there is a fault in a path between the first power source and the load and the method 4000 proceeds to 4060. As such, the fault may be a loose joint on the first power source side. If no, the method 4000 proceeds to 4040.

At 4040, the fault identifier determines whether the first set of contact resistances is less than the threshold resistance and the second set of contact resistances is greater than the threshold resistance. If yes, at 4045 the fault identifier determines that there is a fault in a path between the second power source and the load and the method 4000 proceeds to 4060. As such, the fault may be a loose joint on the second power source side. If no, the method 4000 proceeds to 4050.

At 4050, the fault identifier determines that there is a fault in at least one of the switch and a joint on load side, the fault in one of the switch and the joint on the load side being a common path fault. For example, a fault in any of the switches 101-103 and joints 131-133 of FIG. 1 on the load side is a common path fault. This is because it can be deduced that the fault must be in the switch or the joint on the load side if both the first set of contact resistances and the second set of contact resistances are greater than the threshold contact resistance.

At 4060, the controller transmits an alert to the user about the fault. The alert may identify the fault (e.g., a faulty switch, loose joint on the first source power side, a loose joint on the second source power side, a loose joint on the load side), and the specific location (e.g., without limitation, the first power source load side, the second power source load side, the load side) of the fault.

At 4070, the user remedies the fault. The user may inspect the identified location of the fault, and remedy the fault by, e.g., without limitation, tightening a loose joint or replacing the switch.

At 4080, the ATS performs normal operation. The normal operation includes detecting and identifying a fault, etc.

Figure 5:
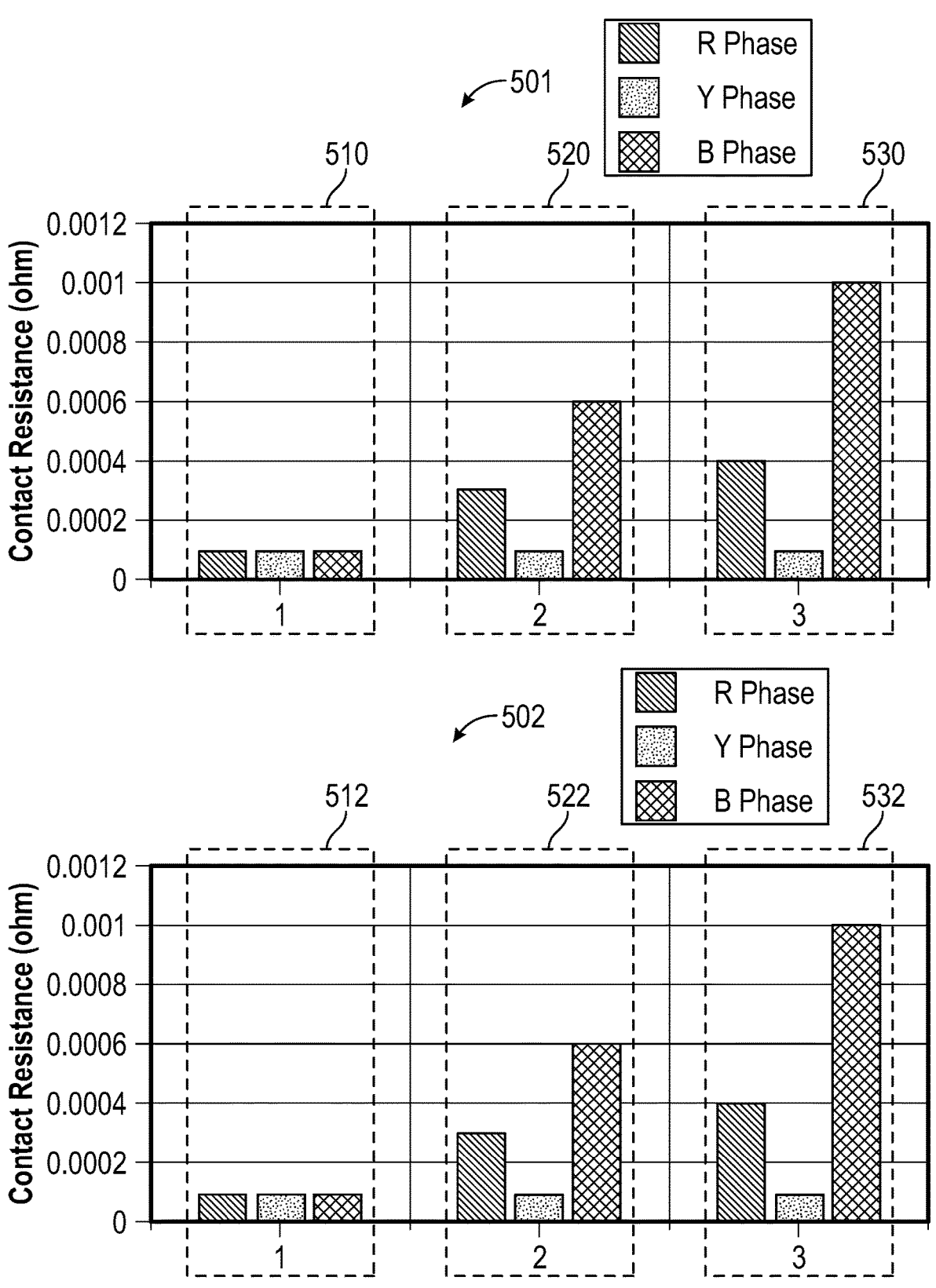
FIG. 5 illustrates simulated identification of a fault location within the automatic transfer switch of FIG. 1 in accordance with an example embodiment of the disclosed concept.

FIG. 5 illustrates simulation for identifying a fault location using the ATS 20 of FIG. 1 in accordance with an example embodiment of the disclosed concept. The contact resistances are obtained based on measurements of line voltages and phase currents. If contact resistance of each phase is less than a threshold contact resistance, then a switch and joints in each phase of respective power source side is healthy. If not, the fault identifier can subtract each phase contact resistance when the load is coupled to the second power source from respective phase contact resistance when the load is coupled to the first power source. For example, the fault identifier obtains change in contact resistance in R-phase by subtracting R-phase contact resistance on the second power source side from R-phase contact resistance on the first power source side. If the change is zero, then the fault is with the switch (e.g., without limitation, wear in contactor plate). That is, since both the contact resistance when the load is connected to the first power source and the contact resistance when the load is connected to the second power source have the same contact resistance value, the fault may be a common path fault (e.g., without limitation, a fault in a switch and/or at a joint on the load side). If the change is not zero, there is a loose joint at a power source side associated with high contact resistance.

Referring back to FIG. 5, graphs 501 include graphs illustrating each phase contact resistance when the load is coupled to the first power source. Graph 510 shows contact resistance for switches and joints healthy condition, and graphs 520,530 show R-phase and B-phase including the switches and/or joints that are faulty. Graphs 530 include the

|

R-phase and B-phase including faults with higher severity than those of the R-phase and B-phase of graphs 520. Graphs 502 include graphs illustrating each phase contact resistance when the load is coupled to the second power source. Graphs 512 show contact resistance of switches and joints in healthy condition, and graphs 522,532 show R-phase and B-phase including the switches and/or joints that are faulty. Graphs 532 include the R-phase and B-phase including faults with higher severity than those of the R-phase and B-phase of graphs 522. When the switches and joints are in healthy condition 510,512, contact resistances for all phases are the same. When one or more switches and/or joints are faulty 520,522,530,532, the one or more contact resistances are higher than those of the healthy contact resistance. In short, these graphs illustrate that both the first and second power source sides include loose joints in R-phase and B-phase 520,522,530,532, and the severity of the faults are higher in those phases in graphs 522,532.

Figure 6:
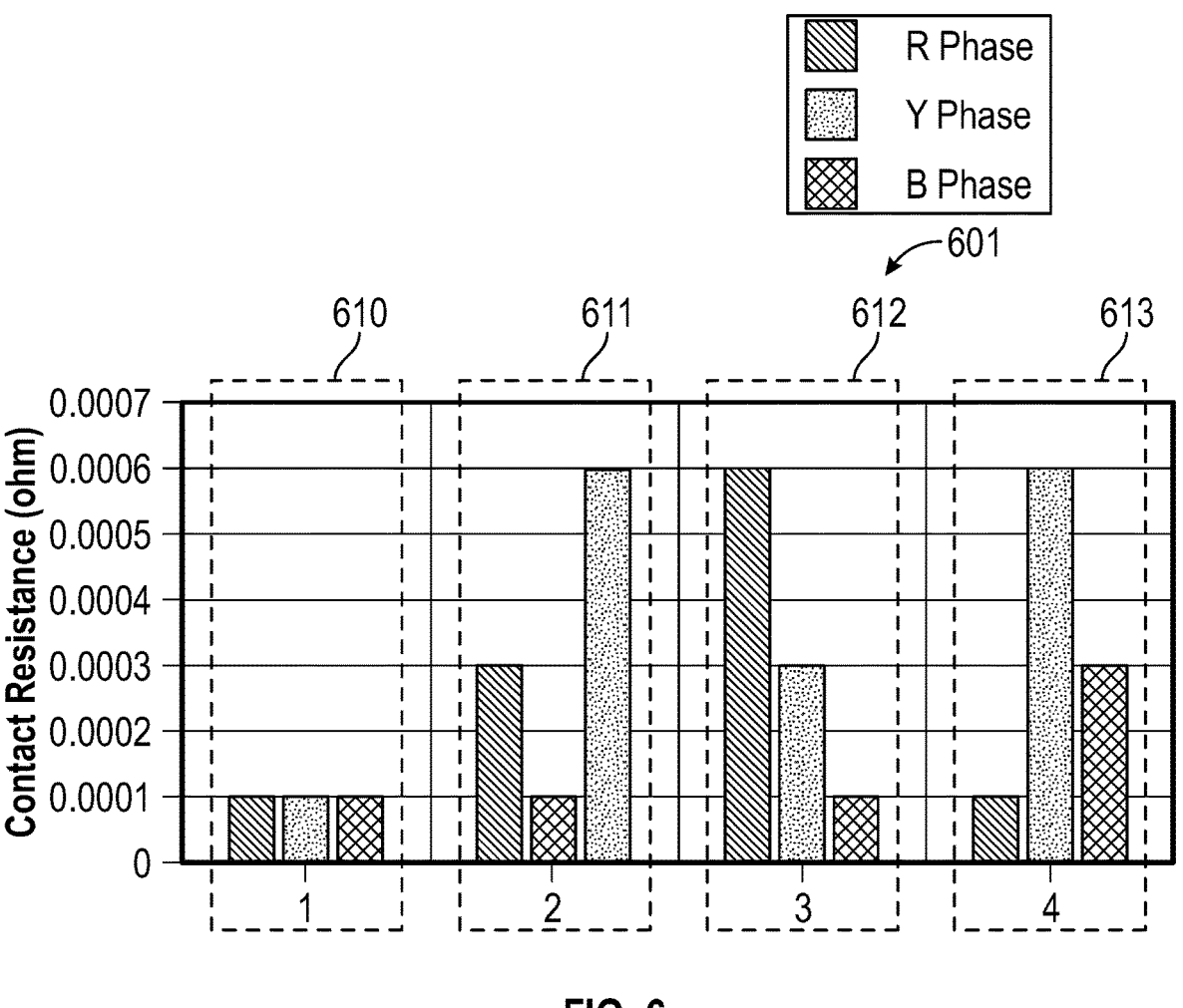
FIG. 6 illustrates simulated identification of a faulty phase within the automatic transfer switch of FIG. 1 in accordance with an example embodiment of the disclosed concept.

FIG. 6 illustrates simulation 601 of a faulty phase identification on a power source side in accordance with an example embodiment of the disclosed concept. The contact resistances are obtained based on measurements of line voltages and phase currents. 610 are graphs of contact resistances of switches and joints in each phase in healthy condition. Changes in contact resistances in each phase are measured as compared to respective contact resistances for the healthy switch and joints. Graphs 611, 612 and 613 show that same fault levels in contact resistances have occurred at three different phases R, Y and B. Where changes in contact resistances for both phases R and B are high as shown in 611, the fault identifier determines that it is the R phase that has high contact resistance, and thus the R-phase on the power source side has a fault (e.g., a loose joint). Where changes in contact resistances for both phases R and Y are high as shown in 612, the fault identifier determines that it is the Y-phase that has high contact resistance, and thus Y-phase on the power source side has a fault. Where changes in contact resistances for both phases Y and B are high as shown in 613, the fault identifier determines that it is the B phase that has high contact resistance, and thus B-phase has a fault. This is because line voltages $V_{RY}$, $V_{YB}$ and $V_{BR}$ are measured where the phase R is common in both $V_{RY}$ and $V_{BR}$ voltages. Therefore, if the phase voltage is considered, in the first and third phases only the resistance of the corresponding phase (Y phase and B phase, respectively) would increase as a result of the fault.

Figure 7:
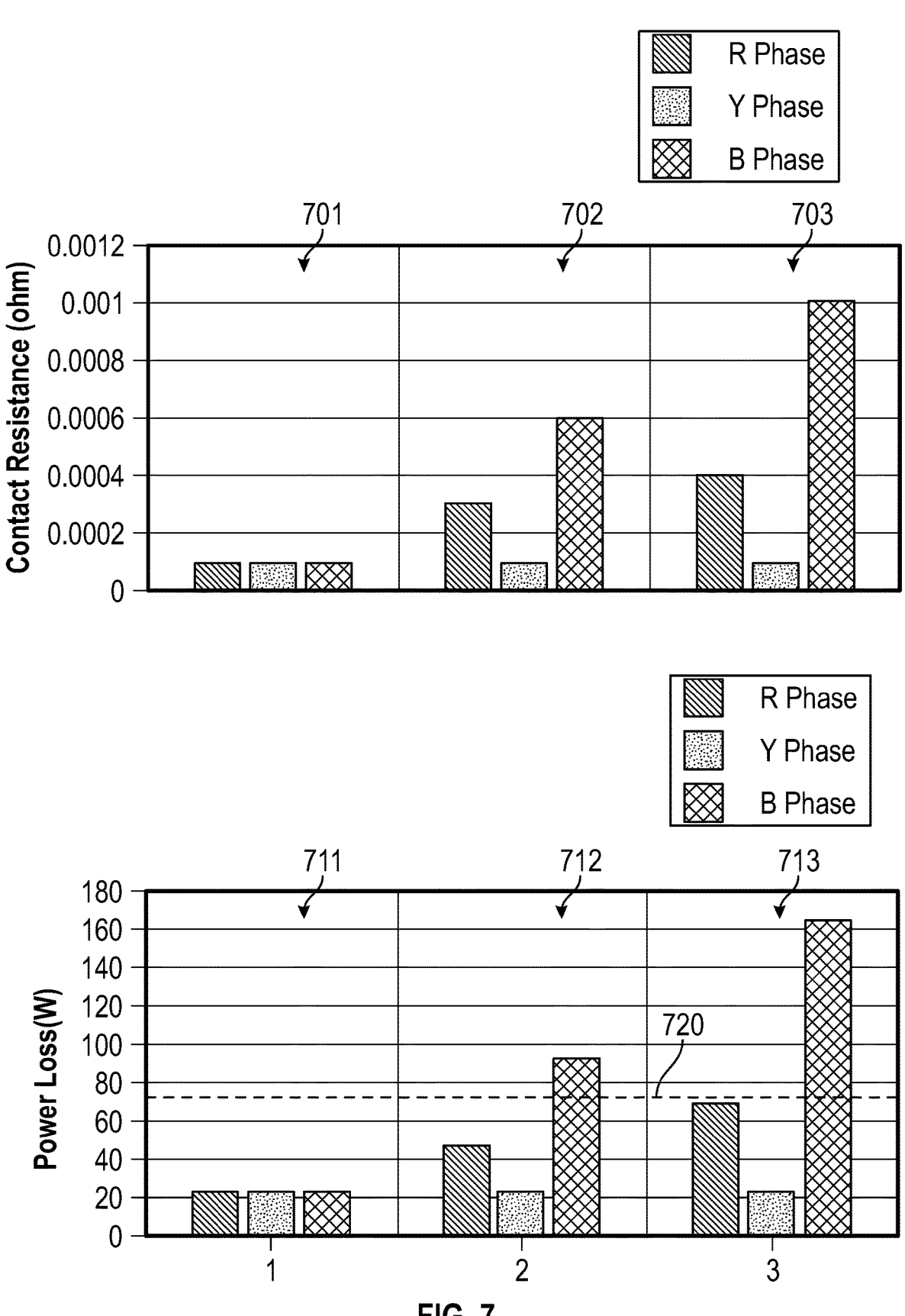
FIG. 7 illustrates simulated estimation of fault severity within the automatic transfer switch of FIG. 1 in accordance with an example embodiment of the disclosed concept.

FIG. 7 illustrates simulation for estimating fault severity in accordance with an example embodiment of the disclosed concept. The contact resistances and power losses are based on line voltages and phase currents measurement. 701 are graphs of contact resistances in each phase for switches and joints in healthy condition. Graphs 702,703 show changes in contact resistances for R-phase and B-phase as compared to the respective healthy contact resistances. Graphs 703 show increased changes in contact resistances for the R-phase and B phase as compared to the contact resistances of these phases shown in 702. Where changes in contact resistances for both phases R and B are high, the fault identifier determines that it is the R phase that has high contact resistance, and thus the R-phase has a fault (e.g., a loose joint in the R-phase on the power source side). Where changes in contact resistances for both phases R and Y are high, the fault identifier determines that it is the Y phase that has high contact resistance, and thus the Y phase has a fault. Where changes in contact resistances for both phases Y and B are high, the fault identifier determines that it is the B phase that has high contact resistance, and thus the B phase has a fault. 711 are graphs of power losses for switches and joints in each phase in healthy condition. 712 are graphs of changes in power losses for R-phase and B-phase as compared to the healthy power losses. 713 are graphs of increased changes in power losses for R-phase and B phase as compared to the changes in power losses for these phases shown in 712. 712 and 713 show that the power losses in the B-phase are higher than threshold power loss 720. A power loss will lead to an increase in hot spot temperature. If the power loss is more than the threshold power loss, the controller will generate an alarm. Fault with power loss less than the threshold power loss is deemed tolerable since lower power loss results in less increase in hot spot temperature, and thus less degradation of the affected component (e.g., loose joint, worn switch).

Figure 8:
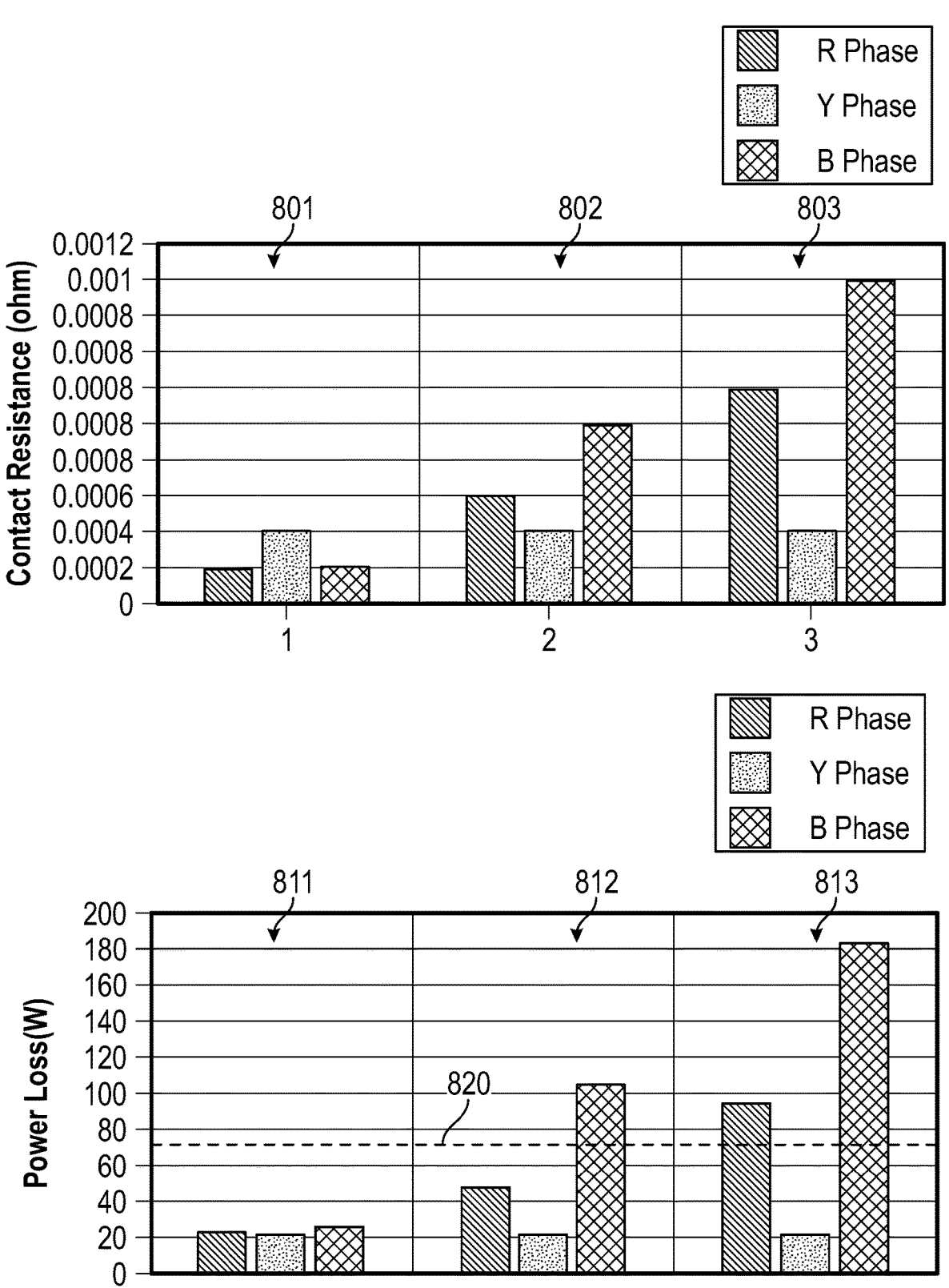
FIG. 8 illustrates simulated fault detection and severity estimation under 3-phase unbalance currents in accordance with an example embodiment of the disclosed concept.

FIG. 8 illustrates simulation of fault detection and severity estimation under 3-phase unbalance currents using the ATS 20 of FIG. 1 in accordance with an example embodiment of the disclosed concept. The contact resistances and power losses are based on line voltages and phase currents measurement. 801 are graphs of contact resistances in each phase for switches and joints in healthy condition. Graphs 802,803 show changes in contact resistances for R-phase and B-phase as compared to the respective healthy contact resistances. Graphs 803 show increased changes in contact resistances for the R-phase and B phase as compared to the contact resistances of these phases shown in 802. Where changes in contact resistances for both phases R and B are high, the fault identifier determines that it is the R phase that has high contact resistance, and thus the R-phase has a fault (e.g., a loose joint in the R-phase on the power source side). Where changes in contact resistances for both phases R and Y are high, the fault identifier determines that it is the Y phase that has high contact resistance, and thus the Y phase has a fault. Where changes in contact resistances for both phases Y and B are high, the fault identifier determines that it is the B phase that has high contact resistance, and thus the B phase has a fault. 811 are graphs of power losses for switches and joints in each phase in healthy condition. 812 are graphs of changes in power loss for R-phase and B-phase as compared to the respective healthy power losses. 813 are graphs of increased changes in power losses for R-phase and B phase as compared to the changes in power losses for these phases shown in 812. 812 and 813 show that the power losses in B-phase is higher than threshold power loss 820. 813 also shows that the power loss in R-phase is higher than the threshold power loss 820. If the power loss is more than the threshold power loss, the fault identifier or controller will generate an alarm. Fault with power loss less than the threshold power loss is deemed tolerable since lower power loss results in less increase in hot spot temperature, and thus less degradation of the affected component (e.g., loose joint, worn switch).

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. An automatic transfer switch (ATS) structured to switch between a first power source and a second power source to supply continuous power to a load, the automatic transfer switch comprising:

a power switching mechanism including a switch structured to couple the load to one of the first power source and the second power source;

a plurality of sensors including a voltage sensor coupled to a joint on first power source side, a voltage sensor coupled to a joint on second power source side, a voltage sensor coupled to a joint on load side, and a current sensor structured to sense current flowing through the switch; and a controller coupled to the power switching device and the plurality of sensors and structured to control operation of the ATS, the controller comprising a processor and a memory, the memory storing a fault identifier configured to detect and identify a fault within the ATS and estimate severity of the fault via:

obtaining root-mean-square (RMS) values including input voltage from a connected power source, output voltage to the load, and the current flowing through the switch;

obtaining delta voltage between the input voltage and the output voltage; and obtaining a power loss and a contact resistance over the switch, the power loss obtained by multiplying the delta voltage with the current flowing through the switch and the contact resistance obtained by dividing the delta voltage by the current flowing through the switch.

2. The automatic transfer switch of claim 1, wherein the fault identifier is further structured to determine that there is a fault based on a determination that the contact resistance is greater than a threshold contact resistance, and wherein for estimating severity of the fault, the fault identifier is structured to determine if the power loss is within a threshold power loss.

3. The automatic transfer switch of claim 2, wherein the fault identifier is further structured to cause the ATS to tolerate the fault and perform normal operation based on a determination that the power loss is within the threshold power loss, or wherein, based on a determination that the power loss is beyond the threshold power loss, the controller is further structured to transmit an alert to a user about the fault such that the user remedies the fault based on the alert.

4. The automatic transfer switch of claim 1, wherein the fault identifier is further structured to identify a specific location of the fault.

5. The automatic transfer switch of claim 4, wherein the first power source and the second power source each comprise a multi-phase power source, and the fault identifier determines that the fault is in a path between the first power source and the load if a first set of contact resistances of all of the phases obtained when the first power source is coupled to the load is greater than the threshold contact and if a second set of contact resistances of all of the phases obtained when the second power source is coupled to the load is lesser than the threshold contact resistance.

6. The automatic transfer switch of claim 4, wherein the first power source and the second power source each comprise a multi-phase power source, and the fault identifier determines that the fault is in a path between the second power source and the load if a second set of contact resistances of all of the phases obtained when the second power source is coupled to the load is greater than the threshold contact and if a first set of contact resistances of all of the phases obtained when the first power source is coupled to the load is lesser than the threshold contact resistance.

7. The automatic transfer switch of claim 4, wherein the first power source and the second power source each comprise a multi-phase power source, and the fault identifier determines that the fault is a common path fault including a fault in at least one of switches or joints on the load side based on a determination that a first set of contact resistances of all of the phases obtained when the first power source is coupled to the load is greater than the threshold contact resistance and a second set of contact resistances of all of the phases obtained when the second power source is coupled to the load is also greater than the threshold contact resistance, the load side being a common path for the fault.

8. The automatic transfer switch of claim 4, wherein the first power source and the second power source each comprise a three-phase power source, and the fault identifier determines that fault is in a first phase based on a determination that changes in contact resistances in the first phase and a third phase are higher than contact resistances of these phases obtained when switches and joints in these phases are in healthy condition, wherein the fault identifier determines that fault is in a second phase based on a determination that changes in contact resistances in the first phase and the second phase are higher than contact resistances of these phases obtained when switches and joints in these phases are in healthy condition, or wherein the fault identifier determines that fault is in the third phase based on a determination that changes in contact resistances in the second phase and the third phase are higher than contact resistances of these phases obtained when switches and joints in these phases are in healthy condition.

9. The automatic transfer switch of claim 1, wherein the first power source and the second power source each comprise one of a single phase AC power source, a multi-phase AC power source, a single phase DC power source, and a multi-phase DC power source.

10. A method of monitoring joint and switch conditions in an automatic transfer switch (ATS), comprising:

providing an ATS structured to switch between a first power source and a second power source to supply continuous power to a load, the ATS comprising: (i) a power switching mechanism including a switch structured to couple the load to one of the first power source and the second power source; (ii) a plurality of sensors including a voltage sensor coupled to a joint on first power source side, a voltage sensor coupled to a joint on second power source side, a voltage sensor coupled to a joint on load side, and a current sensor structured to sense current flowing through the switch; and (iii) a controller coupled to the power switching device and the plurality of sensors and structured to control operation of the ATS, the controller comprising a processor and a memory, the memory storing a fault identifier configured to detect and identify a fault within the ATS and estimate severity of the fault via:

obtaining root-mean-square (RMS) values including input voltage from a connected power source, output voltage to the load, and the current flowing through the switch;

obtaining delta voltage between the input voltage and the output voltage; and obtaining a power loss and a contact resistance over the switch, wherein the power loss is obtained by multiplying the delta voltage with the current flowing through the switch and the contact resistance is obtained by dividing the delta voltage by the current flowing through the switch.

11. The method of claim 10, further comprising:

determining that there is a fault based on a determination that the contact resistance is greater than a threshold contact resistance, and determining if the power loss is within a threshold power loss.

12. The method of claim 11, further comprising:

tolerating the fault and performing normal operation based on a determination that the power loss is within the threshold power loss, or based on a determination that the power loss is beyond the threshold power loss, transmitting an alert to a user about the fault such that the user remedies the fault based on the alert.

13. The method of claim 10, further comprising:

identifying a specific location of the fault.

14. The method of claim 13, wherein the first power source and the second power source each comprise a multiphase power source, and the identifying the specific location of the fault comprises:

determining that the fault is in a path between the first power source and the load if a first set of contact resistances of all of the phases obtained when the first power source is coupled to the load is greater than the threshold contact and if a second set of contact resistances of all of the three phases obtained when the second power source is coupled to the load is lower than the threshold contact resistance.

15. The method of claim 13, wherein the first power source and the second power source each comprise a multiphase power source, and the identifying the specific location of the fault comprises:

determining that the fault is in a path between the second power source and the load if a second set of contact resistances of all of the phases obtained when the second power source is coupled to the load is greater than the threshold contact and if a first set of contact resistances obtained when the first power source is coupled to the load is lower than the threshold contact resistance.

16. The method of claim 13, wherein the first power source and the second power source each comprise a multiphase power source, and the identifying the specific location of the fault comprises:

determining that the fault is a common path fault including a fault in at least one of switches or joints on the load side based on a determination that a first set of contact resistances of all of the phases obtained when the first power source is coupled to the load is greater than the threshold contact resistance and a second set of contact resistances of all of the phases obtained when the second power source is coupled to the load is also greater than the threshold contact resistance.

17. The method of claim 10, wherein the first and second power sources are 3-phase power sources, the method further comprising:

identifying that the fault is in a specific phase.

18. The method of claim 17, wherein the identifying that the fault is in a specific phase comprises:

determining that fault is in a first phase based on a determination that changes in contact resistances in the first phase and a third phase are higher than contact resistances of these phases obtained when switches and joints in these phases are in healthy condition, determining that fault is in a second phase based on a determination that changes in contact resistances in the first phase and the second phase are higher than contact resistances of these phases obtained when switches and joints in these phases are in healthy condition, or determining that fault is in the third phase based on a determination that changes in contact resistances in the second phase and the third phase are higher than contact resistances of these phases obtained when switches and joints in these phases are in healthy condition.

19. An energy monitoring system comprising:

a plurality of power sources including a first power source and a second power source;

a load; and an automatic transfer switch (ATS) structured to connect the load to one of the first power source and the second power source, switch between the first power source and the second power source based at least in part on a power outage or a user command, and supply continuous power to the load, the automatic transfer switch comprising:

a power switching mechanism including a switch structured to couple the load to one of the first power source and the second power source;

a plurality of sensors including a voltage sensor coupled to a joint on first power source side, a voltage sensor coupled to a joint on second power source side, a voltage sensor coupled to a joint on load side, and a current sensor structured to sense current flowing through the switch; and a controller coupled to the power switching mechanism and the plurality of sensors and structured to control operation of the ATS, the controller comprising a processor and a memory, the memory storing a fault identifier configured to detect and identify a fault within the ATS and estimate severity of the fault via:

obtaining root-mean-square (RMS) values including input voltage from a connected power source, output voltage to the load, and the current flowing through the switch;

obtaining delta voltage between the input voltage and the output voltage; and obtaining a power loss and a contact resistance over the switch, the power loss obtained by multiplying the delta voltage with the current flowing through the switch and the contact resistance obtained by dividing the delta voltage by the current flowing through the switch.

* * * * *